(12) United States Patent
Park et al.

(10) Patent No.: US 8,552,305 B2
(45) Date of Patent: Oct. 8, 2013

(54) ELECTRONIC COMPONENT-EMBEDDED PRINTED CIRCUIT BOARD

(75) Inventors: Jin Seon Park, Seoul (KR); Sung Yi, Gyunggi-do (KR); Jung Won Lee, Seoul (KR)

(73) Assignee: Samsung Electro-Mechanics Co., Ltd., Suwon, Gyunggi-do (KR)

( * ) Notice: Subject to any disclaimer, the term of this patent is extended or adjusted under 35 U.S.C. 154(b) by 280 days.

(21) Appl. No.: 12/491,043

(22) Filed: Jun. 24, 2009

(65) Prior Publication Data

US 2010/0236821 A1   Sep. 23, 2010

(30) Foreign Application Priority Data

Mar. 19, 2009  (KR) .................. 10-2009-0023449

(51) Int. Cl.
*H05K 1/16* (2006.01)
(52) U.S. Cl.
USPC ............................................................ 174/260
(58) Field of Classification Search
USPC ............................................................ 174/260
See application file for complete search history.

(56) References Cited

U.S. PATENT DOCUMENTS

| | | | |
|---|---|---|---|
| 5,875,100 A * | 2/1999 | Yamashita | 361/764 |
| 5,928,458 A * | 7/1999 | Aschenbrenner et al. | 156/307.1 |
| 6,039,896 A * | 3/2000 | Miyamoto et al. | 252/511 |
| 6,909,054 B2 * | 6/2005 | Sakamoto et al. | 174/260 |
| 7,134,195 B2 * | 11/2006 | Sunohara et al. | 29/832 |
| 2005/0211465 A1 * | 9/2005 | Sunohara et al. | 174/260 |
| 2006/0054352 A1 * | 3/2006 | Ryu et al. | 174/260 |
| 2007/0086174 A1 * | 4/2007 | Minamio et al. | 361/761 |
| 2007/0098995 A1 * | 5/2007 | Masuko et al. | 428/413 |
| 2007/0163887 A1 * | 7/2007 | Hofmann | 205/80 |
| 2007/0227765 A1 * | 10/2007 | Sakamoto et al. | 174/260 |
| 2008/0099911 A1 * | 5/2008 | Machida | 257/723 |
| 2008/0211086 A1 * | 9/2008 | Morita | 257/702 |
| 2010/0140803 A1 * | 6/2010 | Sakamoto et al. | 257/762 |
| 2010/0213597 A1 * | 8/2010 | Sugino et al. | 257/690 |
| 2011/0259630 A1 * | 10/2011 | Park | 174/260 |

FOREIGN PATENT DOCUMENTS

| | | | |
|---|---|---|---|
| JP | 2002009110 A | * | 1/2002 |
| KR | 10-2006-0066115 A | | 6/2006 |

* cited by examiner

*Primary Examiner* — Timothy Thompson
*Assistant Examiner* — Nathan Milakovich
(74) *Attorney, Agent, or Firm* — Blakely Sokoloff Taylor & Zafman LLP (57) ABSTRACT

Disclosed herein is an electronic component-embedded printed circuit board including: a base plate including an insulating resin layer and circuit layers; and an electronic component embedded in the insulating resin layer, wherein the insulating resin layer has a thickness 1.3~3 times greater than that of the electronic component. The electronic component-embedded printed circuit board has an optimum thickness ratio of its constituents in order to minimize the warpage thereof at the time of manufacturing the same.

6 Claims, 7 Drawing Sheets

FIG.1A

Prior art

FIG.1B

Prior art

ELECTRONIC COMPONENT-EMBEDDED PRINTED CIRCUIT BOARD

CROSS REFERENCE TO RELATED APPLICATION

This application claims the benefit of Korean Patent Application No. 10-2009-0023449, filed Mar. 19, 2009, entitled "A printed circuit board comprising a electronic component", which is hereby incorporated by reference in its entirety into this application.

BACKGROUND OF THE INVENTION

1. Field of the Invention

The present invention relates to an electronic component-embedded printed circuit board, and, more particularly, to an electronic component-embedded printed circuit board, which is not warped.

2. Description of the Related Art

Recently, as part of the next-generation multifunctional small-sized packaging technology, the development of a semiconductor chip embedded printed circuit board has attracted considerable attention.

A semiconductor chip embedded printed circuit board is highly-functionalized as well as multi-functionalized and miniaturized, because it provides an expedient which can improve a reliability problem occurring in the course of wire-bonding flip chips or ball grid arrays (BGAs) or in the course of electrically connecting semiconductor chips using a solder ball.

Various methods and designs for thinly fabricating such a semiconductor chip embedded printed circuit board have been developed, but there is a problem in that a warpage phenomenon cannot be overcome and thus the mass production thereof is practically difficult.

Figure 1A:
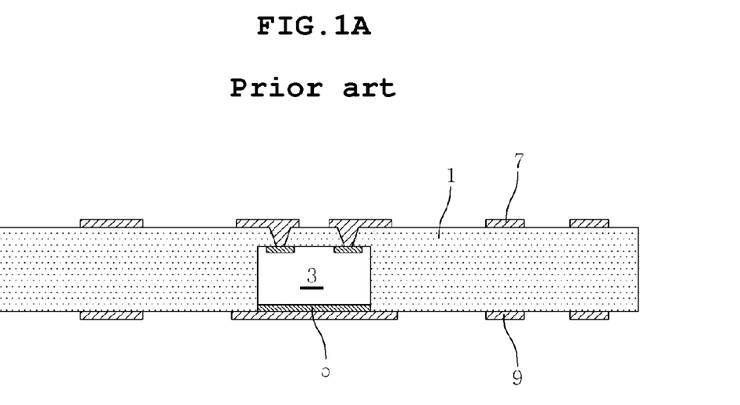
FIG. 1A is a sectional view showing a conventional semiconductor chip embedded printed circuit board.
Figure 1B:
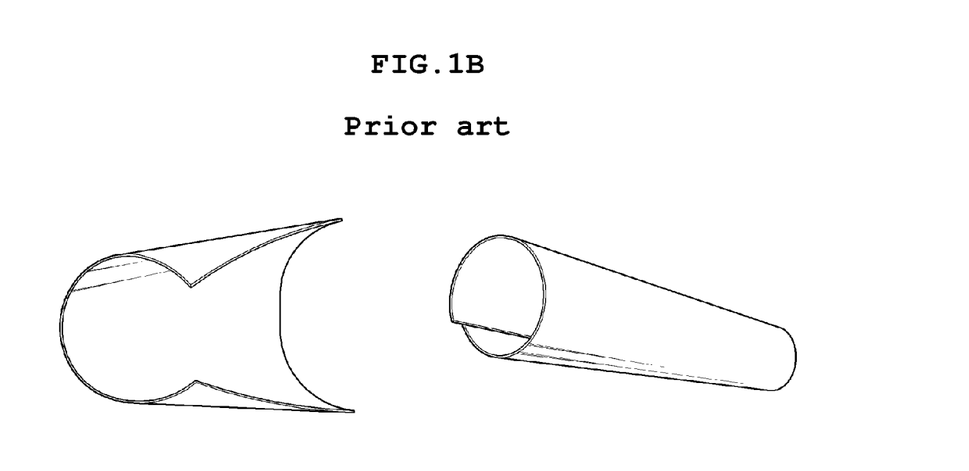
FIG. 1B is a drawing showing a real sample of the printed circuit board manufactured using a conventional technology.

FIG. 1A is a sectional view showing a conventional semiconductor chip embedded printed circuit board, and FIG. 1B is a drawing showing a real sample of the printed circuit board manufactured using a conventional technology.

As shown in FIG. 1A, the conventional semiconductor chip embedded printed circuit board is composed of an insulating layer 1, a semiconductor chip 3, circuit layers 7 and 9 and an resin bonding layer 5, which have thermal expansion coefficients different from each other, so that it is difficult to maintain the balance of thermal expansion coefficients.

Accordingly, in the case where a semiconductor chip embedded printed circuit to board is manufactured through a conventional method, as shown in FIG. 1B, the printed circuit board is warped due to the unbalance of material properties and thermal expansion coefficients of the components. When the printed circuit board is warped, subsequent processes (for example, a circuit forming process, a laser processing process, and the like) cannot be performed, so that it must be discarded or must be manually processed, with the result that the mass production thereof becomes difficult.

Meanwhile, Japanese Unexamined Patent Application Publication No. 2003-127990 discloses a method of manufacturing a semiconductor device embedded printed circuit board in which an insulating layer made of prepreg and resin is embedded with a semiconductor device. However, this method also cannot overcome the above problem that a printed circuit board is warped in the manufacturing method thereof.

Therefore, technologies for preventing the warpage of the semiconductor chip embedded printed circuit board are required.

SUMMARY OF THE INVENTION

Accordingly, the present invention has been made to solve the above-mentioned problems, and the present invention provides an electronic component-embedded printed circuit board, which can remarkably reduce the warpage thereof.

An aspect of the present invention provides an electronic component-embedded printed circuit board comprising: a base plate including an insulating resin layer and circuit layers; and an electronic component embedded in the insulating resin layer, wherein the insulating resin layer has a thickness 1.3~3 times greater than that of the electronic component.

In the electronic component-embedded printed circuit board, the circuit layers may include an upper circuit layer formed on the insulating resin layer and a lower circuit layer formed beneath the insulating resin layer, the insulating resin layer may have a thickness 3~22 times greater than that of the upper circuit layer, and the upper circuit layer may have a thickness 1.1~2.6 times greater than that of the lower circuit layer.

The electronic component-embedded printed circuit board may further include: an adhesion layer interposed between the electronic component and the lower circuit layer, wherein the insulating resin layer has a thickness 3~9 times greater than that of the adhesion layer.

In the electronic component-embedded printed circuit board, the upper circuit layer and the lower circuit layer may be made of copper, and the insulating resin layer 700 may be made of an epoxy resin including O—H, N—H, C—H, C—O and ester groups.

The electronic component may be a silicon semiconductor device.

The adhesion layer may be formed of any one selected from among a die attach film (DAF), an anisotropic conductive film (ACF), a non-conductive film (NCF), an anisotropic conductive adhesive (ACA) and non-conductive adhesive (NCA).

Another aspect of the present invention provides an electronic component-embedded printed circuit board including: a base plate including a prepreg having a space for mounting an electronic component, an insulating layer having a resin layer applied on the prepreg and charged in the space, and circuit layers; and an electronic component mounted in the space, wherein the prepreg has a thickness 1.1~2.5 times greater than that of the electronic component, and the resin layer applied on the prepreg has a thickness 0.2~2.5 times greater than that of the electronic component.

In the electronic component-embedded printed circuit board, the circuit layers may include an upper circuit layer formed on the insulating layer and a lower circuit layer formed beneath the insulating layer, the insulating layer may have a thickness 3~22 times greater than that of the upper circuit layer, and the upper circuit layer may have a thickness 1.1~2.6 times greater than that of the lower circuit layer.

The electronic component-embedded printed circuit board may further include: an adhesion layer interposed between the electronic component and the lower circuit layer, wherein the insulating layer has a thickness 3~9 times greater than that of the adhesion layer.

In the electronic component-embedded printed circuit board, the resin layer may be made of a silicon epoxy hybrid resin including NH, CH, SiH, an aromatic ring, CO, Si—O—Si and Si—O—C, or an epoxy resin.

The electronic component may be a silicon semiconductor device.

The insulating layer may have a thickness 1.2~2 times greater than that of the prepreg.

The adhesion layer may be formed of any one selected from among a die attach film (DAF), an anisotropic conductive film (ACF), a non-conductive film (NCF), an anisotropic conductive adhesive (ACA) and non-conductive adhesive (NCA).

Various objects, advantages and features of the invention will become apparent from the following description of embodiments with reference to the accompanying drawings.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe the best method he or she knows for carrying out the invention.

BRIEF DESCRIPTION OF THE DRAWINGS

The above and other objects, features and advantages of the present invention will to be more clearly understood from the following detailed description taken in conjunction with the accompanying drawings, in which.

DESCRIPTION OF THE PREFERRED EMBODIMENTS

Hereinafter, preferred embodiments of the present invention will be described in detail with reference to the attached drawings. Throughout the accompanying drawings, the same reference numerals are used to designate the same or similar components, and redundant descriptions thereof are omitted. In the following description, the terms "upper", "lower", "first", "second" and the like are used to differentiate a certain component from other components, but the configuration of such components should not be construed to be limited by the terms.

Figure 2:
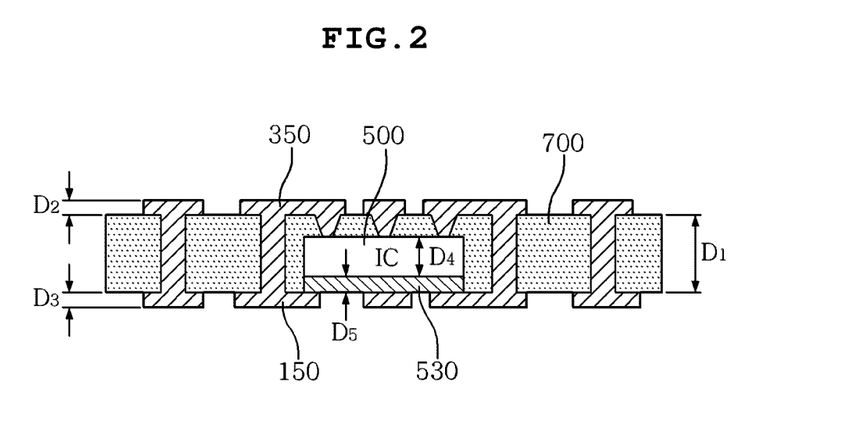
FIG. 2 is a sectional view showing an electronic component-embedded printed circuit board according to an embodiment of the present invention.

FIG. 2 is a sectional view showing an electronic component-embedded printed circuit board according to an embodiment of the present invention.

As shown in FIG. 2, an electronic component-embedded printed circuit board according to this embodiment of the present invention includes: a base plate including an insulating resin layer 700 and circuit layers 150 and 350; and an electronic component 500 embedded in the insulating resin layer 700.

Here, the insulating resin layer 700 may be made of, but not limited to, an epoxy resin including O—H, N—H, C—H, C—O and ester groups, and the electronic component 500 may be a semiconductor device.

In this case, in order to minimize the warpage of a printed circuit board, the thickness (D1) of the insulating resin layer 700 may be 1.3~3 times that (D4) of the electronic component 500.

The thickness ratio of the insulating resin layer 700 and the electronic component 500 is determined by various experiments in which the thermal expansion coefficients of the materials used for the insulating resin layer 700 and the electronic component 500 are considered. That is, it is experimentally proved that an electronic component-embedded printed circuit board which is very difficult to warp can be obtained, when the thickness (D1) of the insulating resin layer 700 is 1.3~3 times that (D4) of the electronic component 500. When the thickness (D1) of the insulating resin layer 700 is less than 1.3 times that (D4) of the electronic component 500, the electronic component 500 can be easily broken at the time of lamination of the electronic component 500. In contrast, when the thickness (D1) of the insulating resin layer 700 is more than 3 times of that (D4) of the electronic component 500, subsequent processes cannot be performed because the warpage of the printed circuit board become serious, and the electrical properties of the printed circuit board deteriorate because the length of a micro via is increased at the time of forming a via in the insulating resin layer through laser processing. Hereinafter, the experimental results thereof will be described.

In this embodiment, the circuit layers 150 and 350 include an upper circuit layer 350 formed on the insulating resin layer 700 and a lower circuit layer 150 formed beneath the insulating resin layer 700. These circuit layers 150 and 150 may be made of an electroconductive metal, such as gold (Au), silver (Ag), copper (Cu), nickel (Ni) or the like, preferably copper, and more preferably low profile copper or very low profile copper.

In this case, the thickness (D2) of the upper circuit layer 350 may be 1.1~2.6 times that (D3) of the lower circuit layer 150. The upper circuit layer 350 is generally formed by etching and plating a resin coated copper (RCC) foil. Since the resin coated copper (RCC) foil has already received thermal hysteresis in the preparation process thereof, it has different tension from that of a copper foil constituting the lower circuit layer 150, whose copper foil did not receive the thermal hysteresis. Therefore, when these RCC foil and copper foil are designed to have the same thicknesses, it causes warpage of panel. Further, if the thickness (D2) of the upper circuit layer 350 is less than 1.1 times or more than 2.6 times of that (D3) of the lower circuit layer 150, the upper circuit layer 350 and lower circuit layer 150 are independently warped, and thus it is impossible to really design them.

Meanwhile, it is verified that when the thickness (D1) of the insulating resin layer is 3~22 times that (D2) of the upper circuit layer 350, the warpage of a printed circuit board can be reduced.

Further, the electronic component-embedded printed circuit board according to this embodiment of the present invention may further include an adhesion layer 530 interposed between the electronic component 500 and the lower circuit layer 150. The adhesion layer 530 serves to fix the electronic component 500 on the lower circuit layer 150 during a process of manufacturing a printed circuit board. The adhesion layer 530 may be formed of any one selected from among a die attach film (DAF), an anisotropic conductive film (ACF), a non-conductive film (NCF), an anisotropic conductive adhesive (ACA) and non-conductive adhesive (NCA), and may include an epoxy resin.

In this case, the thickness (D1) of the insulating resin layer 700 may be 3~9 times that (D5) of the adhesion layer 150, and the thickness (represented by "D1−(D4+D5)") of the insulating resin layer 700 located on the electronic component 500 may be 0.1~0.7 times that (D1) of the total insulating resin layer 700.

Table 1 shows experimental result data for obtaining the thickness ratio of the respective constituents of the printed circuit board according to this embodiment. As shown in Table 1, the optimum thickness ratio of the printed circuit board can be obtained by measuring whether a printed circuit board is warped or not while changing D1~D5. In Table 1, the thickness (D1) of the insulating resin layer 700 is defined as 100, and the thickness ratio of other constituents thereof is represented in percentages to the thickness (D1).

Although Table 1 shows only representative experimental data for the purpose of explaining an experimental method, many experiments was conducted using other experimental data not shown in Table 1 in order to obtain the thickness ratios of the constituents defined in the present invention. Since Table 1 discloses the representative experimental data within the range in which the feature of the present invention is not obscured, the scope of the present invention is not limited to the experimental values shown in Table 1.

TABLE 1

| No. | Thickness of insulating layer (D1) | Thickness of upper circuit layer (D2) | Thickness of lower circuit layer (D3) | Thickness of electronic component (D4) | Thickness of die attach film (D5) | Warpage occurrence |
|---|---|---|---|---|---|---|
| 1 | 100 | 28 | 25 | 63 | 35 | x |
| 2 | 100 | 29 | 26 | 66 | 26 | x |
| 3 | 100 | 27 | 21 | 69 | 27 | x |
| 4 | 100 | 4 | 4 | 50 | 19 | ○ |
| 5 | 100 | 13 | 13 | 75 | 25 | ○ |

(units: %)

Figure 3:
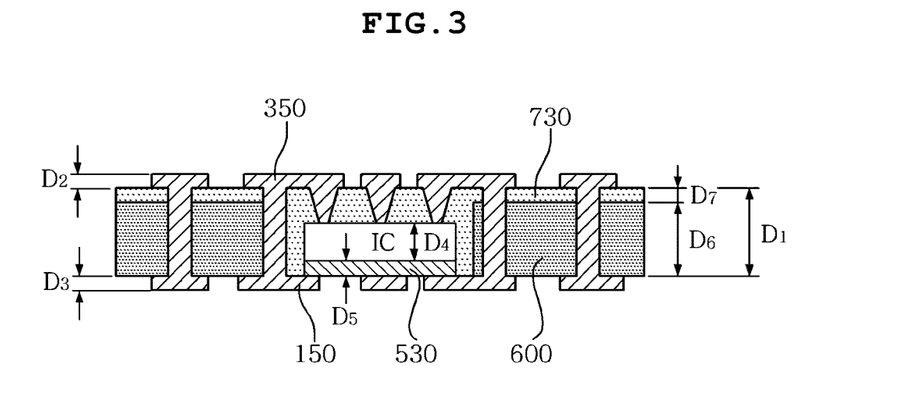
FIG. 3 is a sectional view showing an electronic component-embedded printed circuit board according to another embodiment of the present invention.

FIG. 3 is a sectional view showing an electronic component-embedded printed circuit board according to another embodiment of the present invention. Here, the description duplicating that of the above embodiment will be omitted.

As shown in FIG. 3, an electronic component-embedded printed circuit board according to this embodiment of the present invention includes: a base plate including an insulating layer and circuit layers 150 and 350; and an electronic component 500 embedded in the insulating layer.

In this embodiment, the insulating layer may further include a prepreg provided therein with a space for mounting the electronic component 500; and a resin layer 730 applied on the prepreg 600 and charged in the space.

In this embodiment, the resin layer 730 may be made of, but not limited to, a silicon epoxy hybrid resin including NH, CH, SiH, an aromatic ring, CO, Si—O—Si and Si—O—C or only an epoxy resin. The prepreg 600 may be made of a resin impregnated with a reinforcing material such as glass fiber or the like, and the electronic component 500 may be a silicon semiconductor device.

In this case, in order to reduce the warpage of an electronic component-embedded printed circuit board, the thickness (D6) of the prepreg 600 may be 1.1~2.5 times that (D4) of the electronic component 500, and the thickness (D7) of the resin layer 730 applied on the prepreg 600 may be 0.2~2.5 times that (D4) of the electronic component 500. The thickness ratio of the prepreg 600, the insulating layer 730 and the electronic component 500 is determined by various experiments in which the thermal expansion coefficients of the materials used for the prepreg 600, the insulating layer 730 and the electronic component 500 are considered.

In this case, the total thickness (D1) of the insulating layer may be 1.2~2 times that (D6) of the prepreg 600, and the thickness (represented by "D1−(D4+D5)") of the resin layer 730 located on the electronic component 500 may be 0.1~0.7 times that (D1) of the total insulating layer.

In this embodiment, the circuit layers 150 and 350 include an upper circuit layer 350 formed on the insulating layer and a lower circuit layer 150 formed beneath the insulating layer. These circuit layers 150 and 350 may be made of an electroconductive metal, such as gold (Au), silver (Ag), copper (Cu), nickel (Ni) or the like, preferably copper, and more preferably low profile copper or very low profile copper. In this case, the thickness (D2) of the upper circuit layer 350 may be 1.1~2.6 times that (D3) of the lower circuit layer 150.

Further, in order to reduce the warpage of a printed circuit board, the thickness (D1) of the insulating layer may be 3~22 times that (D2) of the upper circuit layer 350.

Meanwhile, the electronic component-embedded printed circuit board according to this embodiment of the present invention may further include an adhesion layer 530 interposed between the electronic component 500 and the lower circuit layer 150. The adhesion layer 530 may be formed of any one selected from among a die attach film (DAF), an anisotropic conductive film (ACF), a non-conductive film (NCF), an anisotropic conductive adhesive (ACA) and non-conductive adhesive (NCA). In this case, the thickness (D1) of the insulating layer may be 3~9 times that (D5) of the adhesion layer 150.

Table 2 shows experimental result data for obtaining the thickness ratio of the respective constituents of the printed circuit board according to this embodiment. As shown in Table 2, the optimum thickness ratio of the printed circuit board can be obtained to by measuring whether a printed circuit board is warped or not while changing D1~D6. In Table 2, the thickness (D1) of the insulating layer is defined as 100, and the thickness ratio of other constituents thereto is represented as percentages to the thickness (D1).

Although Table 2 shows only representative experimental data for the purpose of explaining an experimental method, many experiments were conducted using other experimental data not shown in Table 2 in order to obtain the thickness ratios of the constituents defined in the present invention. Since Table 2 discloses the representative experimental data within the range in which the feature of the present invention is not obscured, the scope of the present invention is not limited to the experimental values shown in Table 2.

TABLE 2

| No. | Thickness of insulating layer (D1) | Thickness of upper circuit layer (D2) | Thickness of lower circuit layer (D3) | Thickness of electronic component (D4) | Thickness of die attach film (D5) | Thickness of prepreg (D6) | Warpage occurrence |
|---|---|---|---|---|---|---|---|
| 1 | 100 | 26 | 24 | 59 | 24 | 71 | x |
| 2 | 100 | 25 | 22 | 50 | 20 | 89 | x |

TABLE 2-continued

| No. | Thickness of insulating layer (D1) | Thickness of upper circuit layer (D2) | Thickness of lower circuit layer (D3) | Thickness of electronic component (D4) | Thickness of die attach film (D5) | Thickness of prepreg (D6) | Warpage occurrence |
|---|---|---|---|---|---|---|---|
| 3 | 100 | 32 | 26 | 58 | 19 | 78 | x |
| 4 | 100 | 17 | 17 | 41 | 17 | 40 | ○ |
| 5 | 100 | 15 | 13 | 45 | 18 | 30 | ○ |

(units: %)

From Table 2, it can be seen that when the thickness ratio proposed in this embodiment is satisfied, the printed circuit board including the electronic component does not warp, but when the thickness ratio thereof is not satisfied, it warps.

Figure 14:
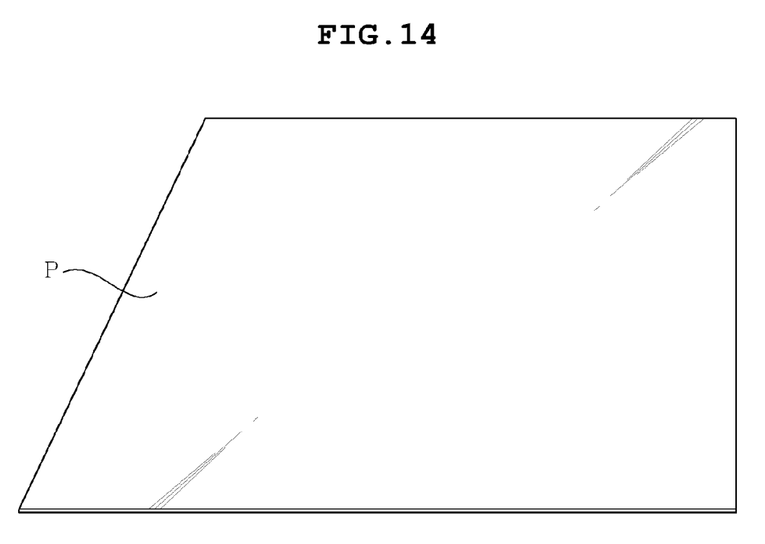
FIG. 14 is a drawing showing a real sample of the electronic component-embedded printed circuit board shown in FIG. 3.

FIG. 14 is a drawing showing a real sample of the electronic component-embedded printed circuit board (P) manufactured at the thickness ratio proposed in this embodiment. From FIG. 14, it can be seen that the printed circuit board manufactured in this way is not warped.

As described above, the electronic component-embedded printed circuit board according to the present invention has an optimum thickness ratio of its constituents such that the warpage thereof is minimized at the time of manufacturing the printed circuit board. Thus, product failure can be remarkably reduced even at the time of mass-producing the electronic component-embedded printed circuit board.

FIGS. 4 to 8 are sectional views showing a process of manufacturing the electronic component-embedded printed circuit board shown in FIG. 2. Hereinafter, a method of manufacturing the electronic component-embedded printed circuit board shown in FIG. 2 will be described in detail with reference to FIGS. 4 to 8.

Figure 4:
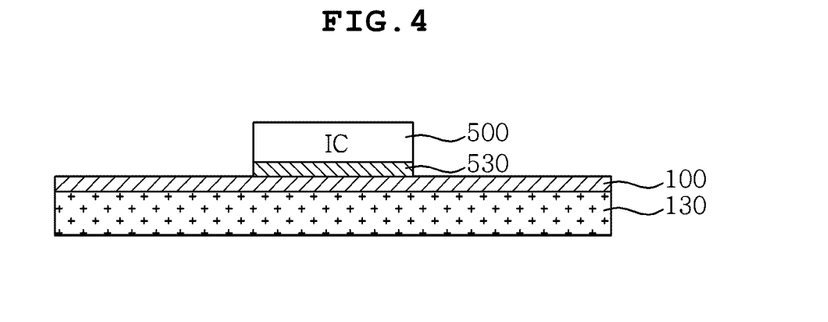
FIGS. 4 to 8 are sectional views showing a process of manufacturing the electronic component-embedded printed circuit board shown in FIG. 2.

First, as shown in FIG. 4, an electronic component 500 laminated with an adhesion layer 530 is attached onto a first copper foil 100 adhered on a carrier foil 130.

Figure 5:
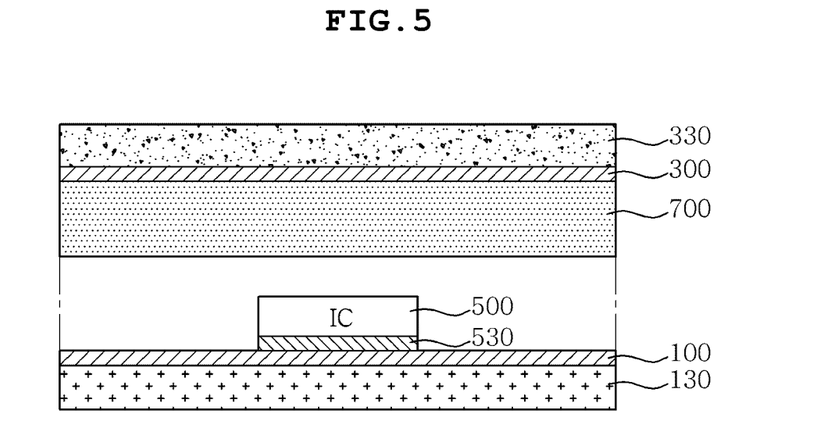

Subsequently, as shown in FIG. 5, the first copper foil 100 is laminated thereon with a resin coated copper (RCC) foil composed of an insulating resin layer 700 and a second copper foil 300. In this case, the second copper foil 300 is coated on one side thereof with a carrier foil 330.

Figure 6:
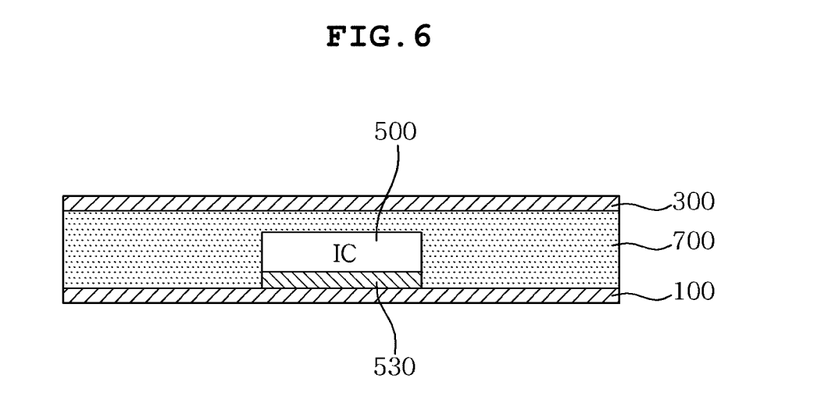

Subsequently, as shown in FIG. 6, the carrier foils 130 and 330 are removed.

Figure 7:
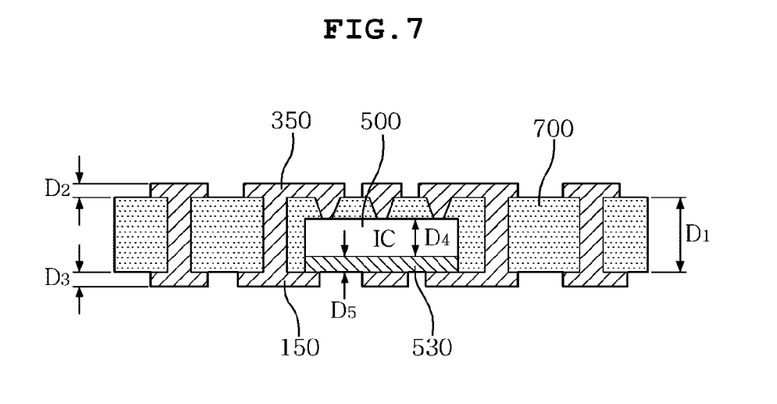

Subsequently, as shown in FIG. 7, an upper circuit layer 350 and a lower circuit layer 150, which include vias electrically connected with the electronic component 500, are formed. Here, since a circuit forming process and a via forming process are performed through commonly-known technologies, the detailed description thereof will be omitted.

Figure 8:
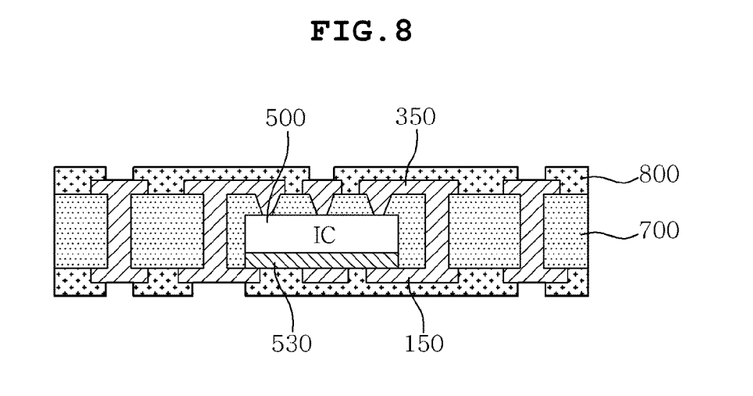

The electronic component-embedded printed circuit board shown in FIG. 2 can be manufactured through the above processes. Subsequently, as shown in FIG. 8, a solder resist layer for exposing external connection terminals 800 may be formed. In addition, it is easily understood that a four or more layered electronic component-embedded printed circuit board can be manufactured by forming a build-up layer on an outer layer of the to electronic component-embedded printed circuit board.

FIGS. 9 to 13 are sectional views showing a process of manufacturing the electronic component-embedded printed circuit board shown in FIG. 3. Hereinafter, a method of manufacturing the electronic component-embedded printed circuit board shown in FIG. 3 will be described in detail with reference to FIGS. 9 to 13.

Figure 9:
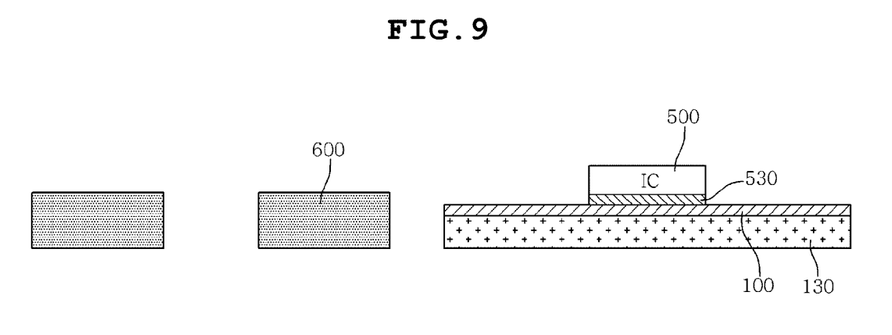
FIGS. 9 to 13 are sectional views showing a process of manufacturing the electronic component-embedded printed circuit board shown in FIG. 3.

First, as shown in FIG. 9, a prepreg 600 in which a space for mounting an electronic component 500 is separately provided, and the electronic component 500 laminated with an adhesion layer 530 is attached onto a first copper foil 100 adhered on a carrier foil 130.

Figure 10:
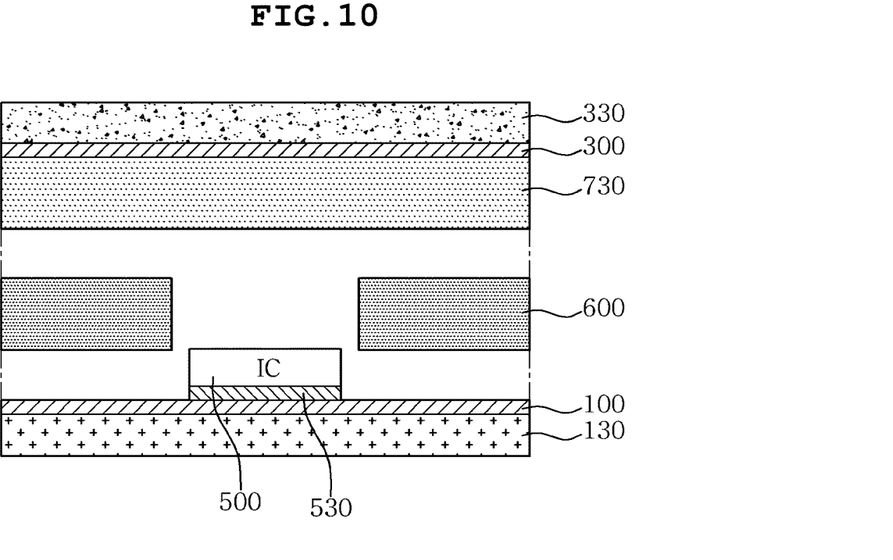

Subsequently, as shown in FIG. 10, the prepreg 600 is placed on the first copper foil 100, and then the first copper foil 100 is laminated thereon with a resin coated copper (RCC) foil composed of a resin layer 700 and a second copper foil 300 such that the resin layer 730 is charged in the space of the prepreg 600. In this case, the second copper foil 300 is coated on one side thereof with a carrier foil 330. In this case, the placement of the prepreg 600 and the lamination of the RCC foil may be performed sequentially or simultaneously.

Figure 11:
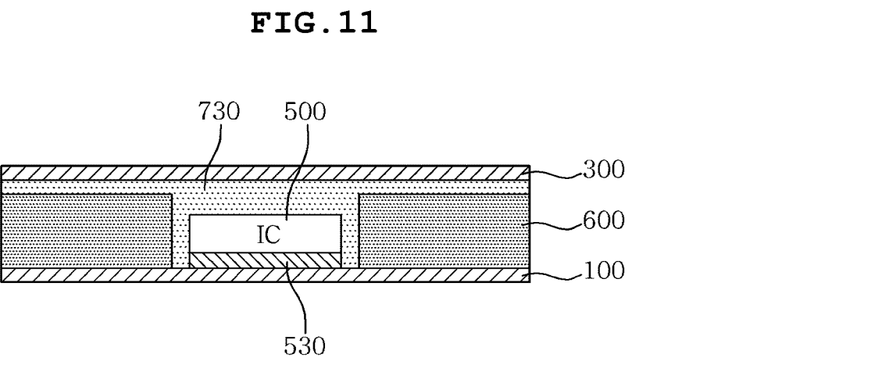

Subsequently, as shown in FIG. 11, the carrier foils 130 and 330 are removed.

Figure 12:
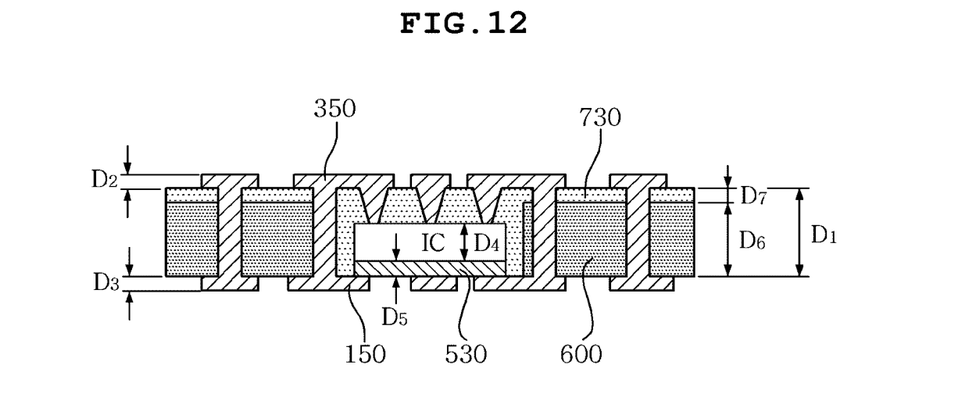

Subsequently, as shown in FIG. 12, an upper circuit layer 350 and a lower circuit layer 150, which include vias electrically connected with the electronic component 500, are formed. Here, since a circuit forming process and a via forming process are performed through commonly-known technologies, the detailed description thereof will be omitted.

Figure 13:
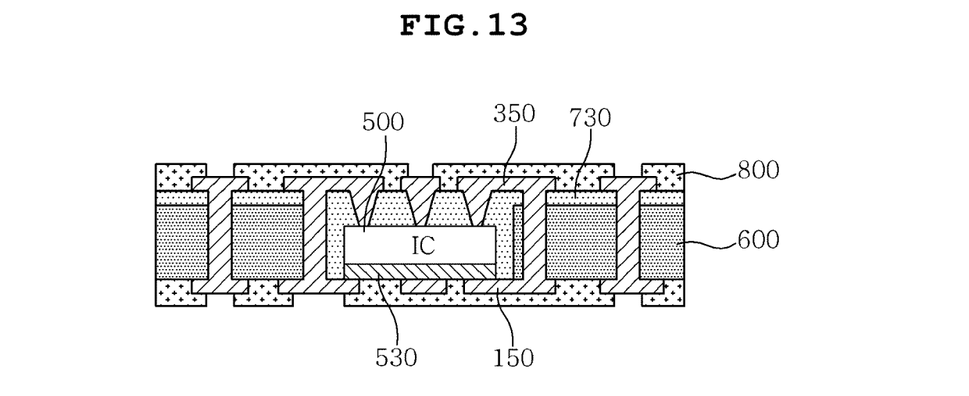

Subsequently, as shown in FIG. 13, a solder resist layer for exposing external connection terminals 800 may be formed. In addition, it is easily understood that a four or more layered electronic component-embedded printed circuit board can be manufactured by forming a build-up layer on an outer layer of the electronic component-embedded printed circuit board.

As described above, the electronic component-embedded printed circuit board according to the present invention has an optimum thickness ratio of its constituents such that the warpage thereof is minimized at the time of manufacturing the printed circuit board. Thus, the product failure of the electronic component-embedded printed circuit board can be remarkably reduced, and the electronic component-embedded printed circuit board can be produced in large quantities.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An electronic component-embedded printed circuit board comprising:
   a base plate including a prepreg having a space for mounting an electronic component, an insulating layer having a resin layer applied on the prepreg and charged in the space, and circuit layers; and
   an electronic component mounted in the space,
   wherein the prepreg has a thickness 1.1~2.5 times greater than that of the electronic component, and the resin layer applied on the prepreg has a thickness 0.2~2.5 times greater than that of the electronic component to reduce warpage of the printed circuit board, and
   wherein the insulating layer has a thickness 1.2~2 times greater than that of the prepreg.

2. The electronic component-embedded printed circuit board according to claim 1, wherein the circuit layers include an upper circuit layer formed on the insulating layer and a lower circuit layer formed beneath the insulating layer, and
wherein the insulating layer has a thickness 3~22 times greater than that of the upper circuit layer, and the upper circuit layer has a thickness 1.1~2.6 times greater than that of the lower circuit layer.

3. The electronic component-embedded printed circuit board according to claim 1, further comprising:
an adhesion layer interposed between the electronic component and the lower circuit layer,
wherein the insulating layer has a thickness 3~9 times greater than that of the adhesion layer.

4. The electronic component-embedded printed circuit board according to claim 1, wherein the resin layer is made of a silicon epoxy hybrid resin including NH, CH, SiH, an aromatic ring, CO, Si—O—Si and Si—O—C, or an epoxy resin.

5. The electronic component-embedded printed circuit board according to claim 1, wherein the electronic component is a silicon semiconductor device.

6. The electronic component-embedded printed circuit board according to claim 3, wherein the adhesion layer is formed of any one selected from among a die attach film (DAF), an anisotropic conductive film (ACF), a non-conductive film (NCF), an anisotropic conductive adhesive (ACA) and non-conductive adhesive (NCA).

* * * * *